US011970904B2

(12) United States Patent
Eggenberger et al.

(10) Patent No.: US 11,970,904 B2
(45) Date of Patent: Apr. 30, 2024

(54) FLEXIBLE SENSOR CURTAIN

(71) Applicant: International Business Machines Corporation, Armonk, NY (US)

(72) Inventors: Christian Eggenberger, Zurich (CH); Jens Rathgeber, Glashütten (DE); Toby Zenerino, Gachnang (CH); Michael Egger, Niederwil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 69 days.

(21) Appl. No.: 16/994,551

(22) Filed: Aug. 14, 2020

(65) Prior Publication Data
US 2022/0049548 A1 Feb. 17, 2022

(51) Int. Cl.
*E06B 9/68* (2006.01)
*E06B 9/40* (2006.01)
*H05K 7/20* (2006.01)

(52) U.S. Cl.
CPC .............. *E06B 9/68* (2013.01); *E06B 9/40* (2013.01); *E06B 2009/407* (2013.01); *E06B 2009/6818* (2013.01); *H05K 7/20209* (2013.01)

(58) Field of Classification Search
CPC .............. H05K 7/20209; E06B 9/68; E06B 2009/6809; E06B 2006/6827
See application file for complete search history.

(56) References Cited

U.S. PATENT DOCUMENTS

| 7,920,100 | B2 | 4/2011 | Brown et al. |
| 8,300,410 | B2 | 10/2012 | Slessman |
| 8,701,737 | B2 * | 4/2014 | Mainers ............ H05K 7/20745 160/1 |
| 9,834,983 | B1 * | 12/2017 | Hall ........................ E06B 9/32 |
| 2009/0073073 | A1 | 3/2009 | Brown et al. |

(Continued)

FOREIGN PATENT DOCUMENTS

| CN | 103385644 A | 11/2013 |
| CN | 107397414 A | 11/2017 |
| CN | 107580695 B | 11/2020 |

OTHER PUBLICATIONS

Raritan, "Rack Mount Temperature & Environmental Monitoring," https://www.raritan.com/landing/rack-mount-temperature-environmental-monitoring, accessed Feb. 10, 2020, 3 pages.

(Continued)

*Primary Examiner* — Johnnie A. Shablack
*Assistant Examiner* — John W Hanes, Jr.
(74) *Attorney, Agent, or Firm* — Daniel Yeates; Andrew D. Wright; Calderon Safran & Cole, P.C.

(57) ABSTRACT

A flexible curtain defines a major surface and is configured to repeatedly actuate to move between a deployed configuration and a stowed configuration. Two sensors are configured to detect different condition and are removably attached to two sensor attachment locations. The major surface extends across an operational surface of a target system such that the sensors detect the conditions of the target system when the flexible curtain defines the deployed configuration. The flexible curtain and the sensors converge at a predetermined edge of the flexible curtain to expose the operational surface of the target system when the flexible curtain defines the stowed configuration.

12 Claims, 7 Drawing Sheets

(56) References Cited

U.S. PATENT DOCUMENTS

| | | |
|---|---|---|
| 2011/0108207 A1 | 5/2011 | Mainers et al. |
| 2012/0014060 A1 | 1/2012 | Slessman |
| 2012/0247750 A1* | 10/2012 | Kobayashi ......... H05K 7/20836 |
| | | 165/287 |
| 2017/0172490 A1 | 6/2017 | Afentakis et al. |
| 2017/0350187 A1 | 12/2017 | Hall et al. |
| 2018/0307114 A1* | 10/2018 | Brown ...................... E06B 9/24 |
| 2019/0119978 A1* | 4/2019 | Hall .................... H04L 12/2818 |
| 2021/0010326 A1* | 1/2021 | Pierce ....................... E06B 9/82 |

OTHER PUBLICATIONS

Anonymous, "Smart isolation curtains," https://priorart.ip.com/ IPCOM/00021085012, Sep. 2011, 3 pages.

* cited by examiner

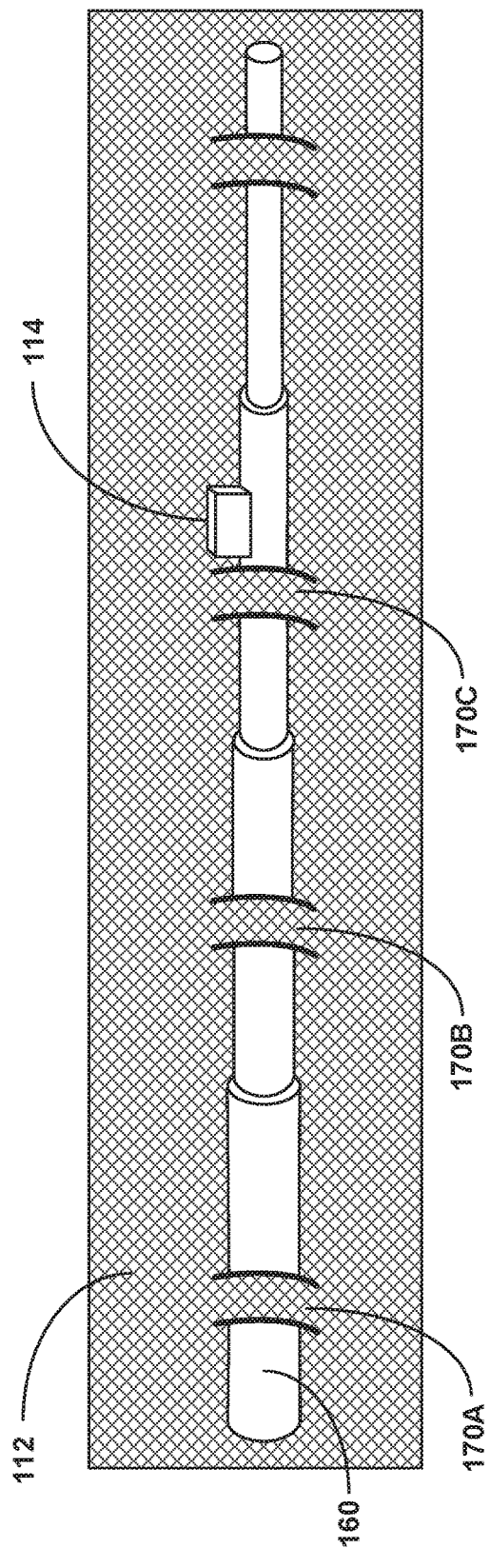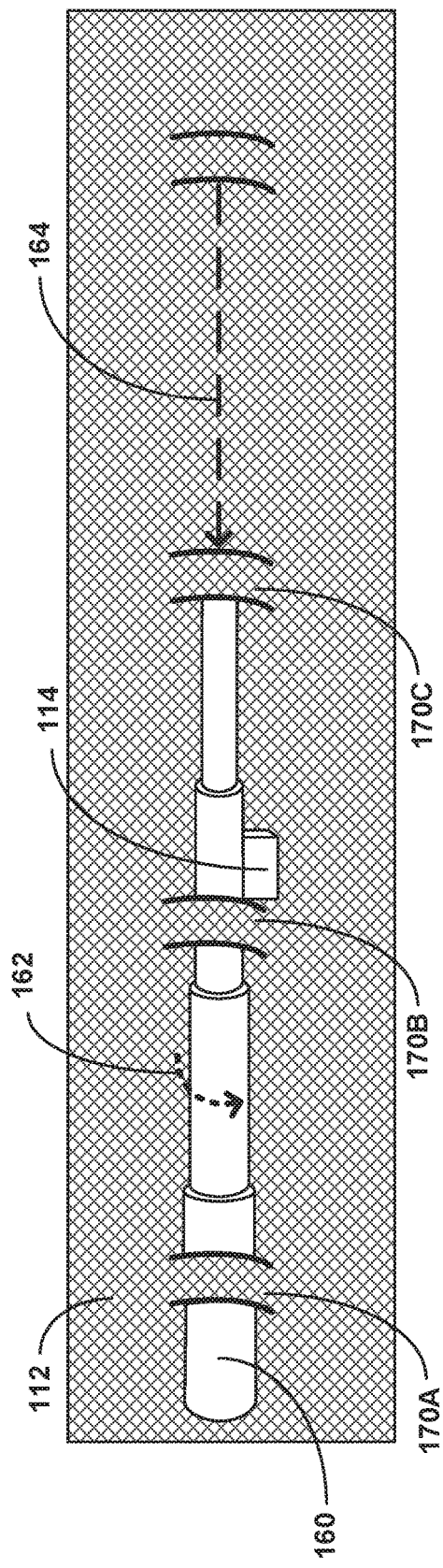

FLEXIBLE SENSOR CURTAIN

BACKGROUND

As computers become increasingly powerful they are paired with increasingly sophisticated systems to ensure that the computers are operating under desired conditions. For example, increased processing power in thinner computers (and therein smaller volumetric areas) have resulted in more heat, requiring more elaborate cooling systems. These concerns may be multiplied for servers that that contain a relatively large amount of computing components. As such, server racks or computing rooms or the like often include monitoring devices to ensure that conditions such as a temperature and humidity and the like are within predetermined thresholds.

SUMMARY

Aspects of the present disclosure relate to a method, system, and computer program product relating to using a flexible curtain to monitor conditions (such as climate conditions) relating to a target computing system. For example, the method includes deploying a flexible curtain from a stowed configuration to a deployed configuration near a target computer system. The flexible curtain defines a major surface. As deployed to the deployed configuration, the major surface extends across an operational surface of a computing system. The method also includes detecting a first and second condition of the computing system via respective first and second sensors. The first and second sensors are removably attached to respective first and second sensor attachment locations of the flexible curtain. The method also includes moving the flexible curtain from the deployed configuration to the stowed configuration to expose the operational surface of the target system. A system and computer product configured to perform the above method are also disclosed.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 2A depicts a sensor attached to a telescopic bar secured to a flexible curtain that is elongated to locate the sensor at a first sensor attachment location.

FIG. 2B depicts the telescopic bar of FIG. 2A that is condensed to locate the sensor at a second sensor attachment location.

Figure 1A:
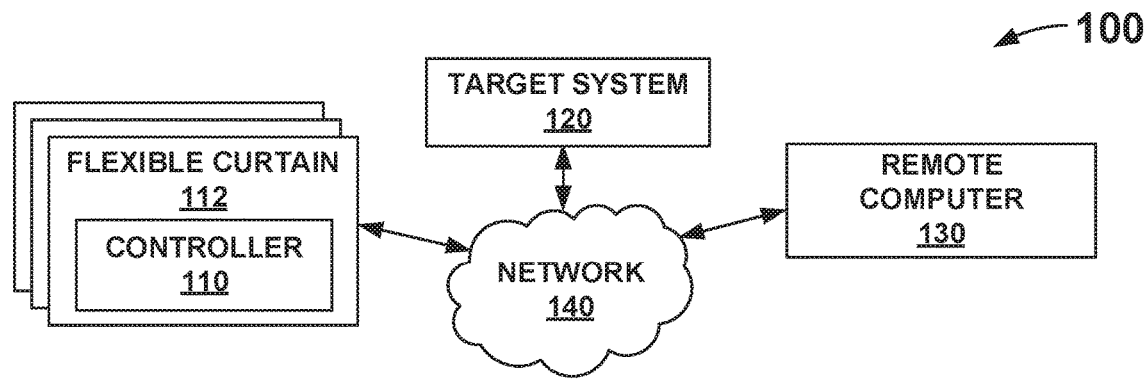
FIG. 1A depicts a conceptual diagram of an example system in which a controller may monitor a target system with a flexible curtain.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to monitoring conditions relating to a computer system, while more particular aspects of the present disclosure relate to using a flexible sensor curtain to monitor environmental conditions of a computer system. While the present disclosure is not necessarily limited to such applications, various aspects of the disclosure may be appreciated through a discussion of various examples using this context.

Computer systems (e.g., racks, servers, storage devices, networking components) may be congregated in data centers or computer rooms. These systems may generate a substantial amount of heat during operation, such that it can be advantageous to keep these systems in a climate-controlled environment to maintain a desired performance. For example, these systems may be designed to operate within a predetermined temperature and humidity range to maintain a desired processing capability while minimizing energy consumption (e.g., where fans or other cooling systems may require additional energy to provide a desired climate. Failing to provide this climate may increase energy consumption, decrease processing capability, and/or decrease an operational service life of one or more of the computer systems.

Towards this end, conventional support systems may be designed to provide a stable environment for these computer systems, such as conventional heating, ventilation, and cooling (HVAC) systems. These conventional HVAC systems may be configured to detect environmental conditions of a room and provide cool air, dehumidified air, or the like so as to maintain the desired environmental conditions. However, these conventional systems may only detect conditions of a room, and may therein fail to identify that, e.g., a single rack is too hot even while the computer room that stores this rack may be an appropriate temperature. These systems may also fail to identify a problem that is creating (or is otherwise associated with) this poor condition, such as, e.g., a unit that is installed incorrectly such that the unit is rotated 180° within a respective port (such that a processing circuit that is intended to be cooled at an outside surface via a cool air stream is instead in an internal location away from where the room provides the cool air stream).

In some examples, a conventional system may include a mobile tray or platform that includes one or more monitoring tools such as an infrared camera that needs to be either physically secured at a location to monitor specific environment conditions around computing components (e.g., measuring inlet air temperature next to an air intake port), or otherwise moved to a location adjacent an external operational surface of the computing system (e.g., where an operational surface is a surface that is designed to be exposed when the computing system is in use). Using this camera, a conventional system may be configured to detect a condition of a component, such as whether a single rack is too hot. However, this conventional system may be relatively cumbersome, and may need to be properly aligned after each time that the cart is moved to measure desired conditions. As such, this conventional system may be prone to user error. Further, such a system may obstruct or otherwise alter an air flow through an environment, potentially impacting an ability of a conventional HVAC system to provide and maintain desired environmental conditions. Further, manufacturers of a computing system may often provide partial (or even no) information as to what conditions a computing system requires for efficient operation and where these conditions are best measured from, such that a camera aligned directly in front of a computing component may fail to detect a pertinent condition even when aligned according to best known practices.

Aspects of this disclosure relate to systems and methods that address these concerns. For example, aspects of this disclosure relate to a flexible curtain to which a plurality of sensors may be attached at a plurality of sensor locations. The flexible curtain is configured to be actuated to move between a stowed and deployed configuration such that sensors are easy to repeatably bring to a desired sensor location. The flexible curtain is configured to monitor conditions of a target system such as a target computer system (e.g., such as a server, storage device, network devices, or the like). These conditions include temperature, humidity, particle mixture (e.g., for air purity or pollution), noise (e.g., to detect fan noise, winding noise during tape measurements, positioning movement noise of the hard disk head), light (e.g., to detect anomalies in the color spectrum such as increased red light compared with green or yellow light, to determine/confirm what device is being monitored by a sensor, to detect pollution via predetermined scattered light spectrums that are associated with pollution via Tyndall effect or the like, to detect if it is daylight or night as may impact operation of computing components), gas (e.g., to detect methane), or the like.

The flexible curtain may be configured to enable air to flow through the major surface of the flexible curtain. For example, the flexible curtain may be partially or entirely an air-permeable mesh, or the flexible curtain may otherwise define a plurality of holes that extend through the major surface. In some examples, the flexible curtain may be partially translucent or transparent, to improve an ability of an operator to visually inspect the target system as the flexible curtain is monitoring the target system. Further, as described above, the flexible curtain may be configured to define a stowed configuration in which the flexible curtain is condensed down into a relatively small size/shape to allow access to the target system. Additionally, the flexible curtain may be configured to extend out to define a deployed configuration in which the sensors are deployed so as to be repeatedly and accurately located adjacent relevant predetermined surfaces of the target system to enable the sensor to monitor conditions of the target system.

The flexible curtain may define a plurality of heights and widths depending upon the size of the target system, and/or the locations on the target system that require monitoring. For example, the flexible curtain may define a size similar to various target systems such as desktop computer tower, server closet, or the like. Further, the flexible curtain may be relatively bigger where an environment enables the flexible curtain to monitor two target systems. In some examples a size of the flexible curtain may be modifiable via the flexible nature of the flexible curtain (e.g., such that an undesired portion of the flexible curtain may be condensed and therein unused for a first application, after which this portion may be deployed for a second application).

The flexible curtain may be configured such that sensors can be secured to the flexible curtain at interchangeable sensor attachment locations, such that one or more sensors may be attached to a plurality of sensor attachment locations. In this way, a flexible curtain may be able to monitor a target system even as that target system changes over time (e.g., by adding new racks, and/or by replacing an old rack with a new rack) by changing which sensors are measuring which conditions, changing the locations of sensors, replacing an initial sensor with a different sensor, or the like. In this way, aspects of the disclosure may provide a modular and flexible means to detect many or substantially all conditions of a target system without encumbering a use or performance of the target system.

In some examples, the sensors may be secured directly to the flexible curtain. For example, a plurality of sensors may be attached to the flexible curtain at a plurality of predetermined different locations, and these different sensors may be turned on and off to measure the same or overlapping conditions for the same or different operational faces of the target system to monitor a target system. In other examples, the sensors may be mounted on components that are themselves secured to the flexible curtain. For example, the sensors may be mounted to bars that are configured to define different lengths and/or diameters, such as telescopic bars (e.g., such that the bars may be condensed and elongated longitudinally). For another example, the sensors may be attached to flexible linkages that can statically define substantially any shape across the major surface of the flexible curtain (e.g., a circle, square, or the like) yet can still be condensed along with the flexible curtain to define the stowed configuration. The sensors may be configured to attach to substantially any side and any portion of these bars and/or frames, and further the sensors may be substantially tamper-proof such that conditions gathered by these sensors are difficult and/or impossible to verify. These flexible frames and/or bars may act as power sources and/or communication means for the sensors, such that the sensors are "plugged in" to the frames and/or bars to detect and communicate various conditions of the target system.

The flexible curtain may include a memory and a processor that is configured to execute instructions stored on the memory to control the sensors to monitor the target system. This memory and processor are generically referred to as a "controller" herein. This controller may be configured to individually control and gather data from single sensors, individually turn sensors on or off, identify conditions of the target system, or the like. The controller may communicate with sensors via any means, such as via a low-power wide-area network (LPWAN), Bluetooth, WiFi, Zigbee, a cellular network, or the like. The controller may further identify where each sensor is (e.g., both in relation to the flexible curtain and in relation to the bar and/or flexible frame to which the sensor is attached as applicable), and/or adjust a location of one or more sensors based on a detected efficiency of conditions as gathered by those sensors. For example, the controller may utilize one or more servo or stepper motors or the like to extend or condense a telescopic bar to which a sensor is attached, or rotate a circular linkage to which the sensor is attached, to thereby change a location of this sensor.

While the flexible curtain is described herein as configured to monitor a computer target system for conditions such as temperature and humidity, the flexible curtain may be utilized for other applications that are consistent with this disclosure. For example, a controller may utilize a flexible curtain to monitor a cooler target system (e.g., a wine cooler, medicine refrigerator, cold storage warehouse), microwave target system (e.g., to identify radiation leaks), a dehydrator target system (e.g., to identify a drying temperature or humidity or the like of different levels), a house target system (e.g., to identify leaking insulation spots), a scaffold net target system (e.g., to identify humidity of a building substance, or humidity during ongoing construction), or the like.

Though a single flexible curtain and a single controller is predominantly discussed herein, in other examples two or more flexible curtains may be stacked on top of each other to monitor one or more target systems. In some examples, the stacked flexible curtains may work together to identify conditions that are difficult or impossible for a single flexible curtain to identify. For example, there may be a maximum number of sensors that may be attached to any given flexible curtain (e.g., five, or sensors, or more sensors), whether in total or just for a single area of the flexible curtain, and it may be advantageous to monitor conditions of a target system using more than that maximum number. In such examples, two or more flexible curtains may be thusly "stacked" to functionally increase the number of sensors monitoring conditions of the target system. For example, there may be a single relatively small point on the operational surface that is advantageous to monitor in a plurality of ways (e.g., monitor for a plurality of environmental conditions), but it may be difficult or impossible to attach a plurality of sensors to a single place on the flexible curtain that lines up with that single relatively small point, but using a plurality of flexible curtains may sensors may be "stacked" such that each can monitor respective conditions of that single relatively small point. In some examples, each of these multiple flexible curtains may be secured to a single rod as described herein.

In this way, aspects of this disclosure may be configured to address the above-described problems. For example, the system described herein may provide a modular, flexible, mobile, and robust solution that is configured to repeatedly monitor substantially any condition for substantially any type of target system, and further be able to dynamically update sensor locations based on new information and/or components over time. Additionally, given the modular nature of aspects of this disclosure, many and/or each component of the solution may be individually replaced and/or upgraded over time to maintain continuity.

Figure 3:
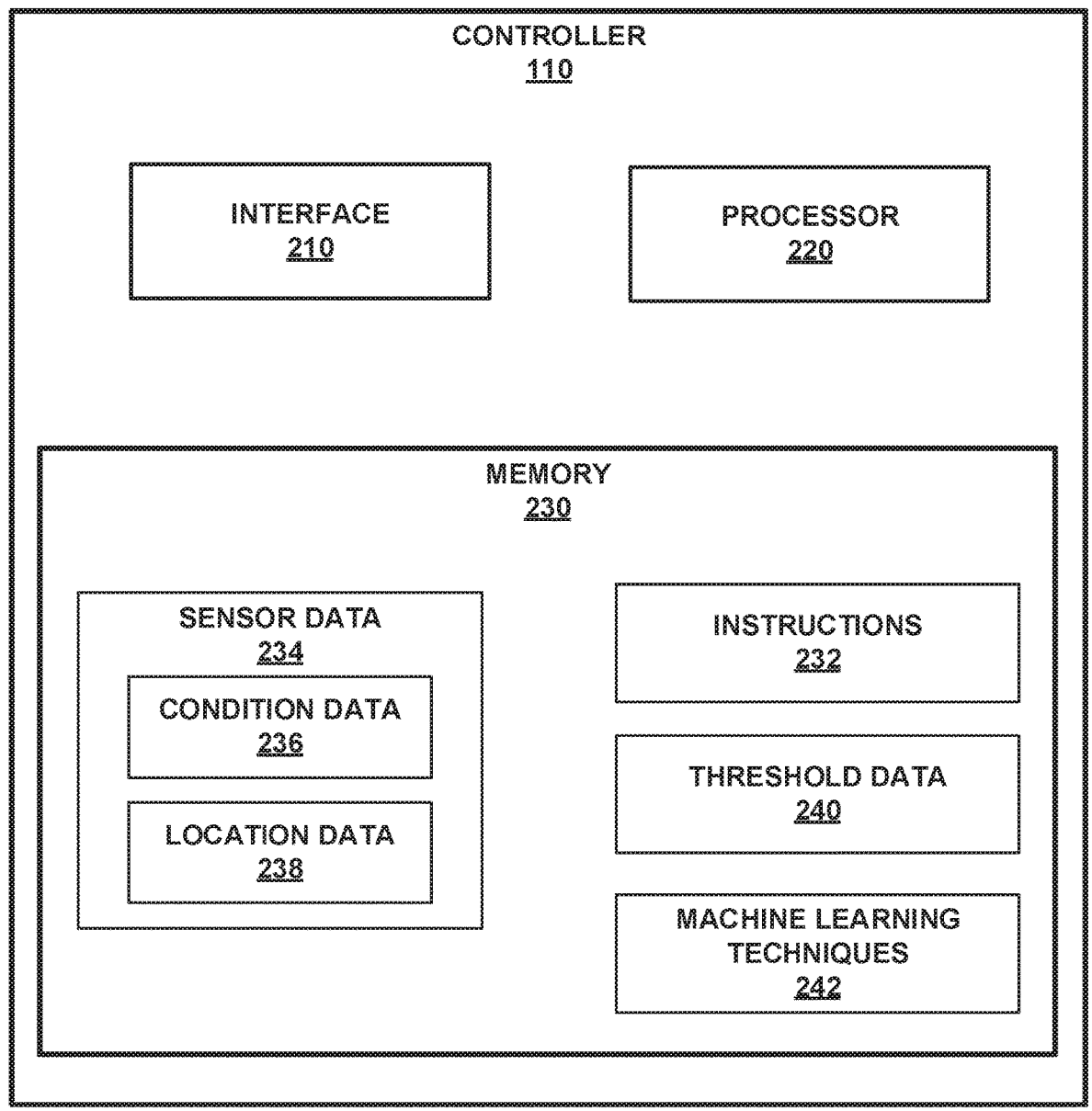
FIG. 3 depicts a conceptual box diagram of example components of the controller of FIG. 1A.

Looking to the figures, FIG. 1A depicts system 100 that includes controller 110 of flexible curtain 112 that is configured to monitor target system 120 as discussed herein. Target system 120 may be any system that warrants monitoring for a plurality of conditions that may be sensed by a computing sensor, such as a computer target system 120 for which heat and humidity conditions are sensed as described herein. As described above, controller 110 may comprise one or more computing elements, such as one or more processing units, interfaces, and/or memories, similar to what is depicted in FIG. 3. Though controller 110 is discussed and depicted predominantly as within a single housing in flexible curtain 112, in other examples the functionality of controller 110 may be provided by a plurality of discrete objects housed within different portions of flexible curtain 112, or with some functionality executed by controller 110 within flexible curtain 112 and another portion within remote computer 130, or the like. For example, in some examples controller 110 may predominantly gather conditions from sensors 114, control whether or not these sensors 114 are currently turned on and/or off, and send this conditions to remote computer 130, after which remote computer 130 executes some or all of the analysis and assessment described herein with respect to sensors 114.

Controller 110 may transmit updates regarding target system 120 to remote computer 130. Remote computer 130 may be a computing device (e.g., a device similar to what is depicted in FIG. 3) used by an operator that manages target system 120. For example, remote computer 130 may include a desktop, laptop, mobile phone, server, or the like. Controller 110 may send reports on sensed conditions of target system 120 to remote computer 130. Additionally, or alternatively, controller 110 may send alerts to remote computer 130 when a sensed condition of target system 120 satisfies an alert threshold (e.g., when a sensed temperature is above a threshold temperature, such that target system 120 is too hot).

In some examples, controller 110 may itself execute an action in response to detecting a condition outside of a threshold, where that action is configured to address this condition. For example, in the detected condition is target system 120 being too hot, controller 110 may move one or more workloads from target system 120 to another system, throttle a processor of target system 120, lower a temperature of the room, increase a fan speed directed toward target system 120, or the like. Controller 110 may cause these actions to take place fully autonomously (e.g., without intervention from a human user). In other examples, controller 110 may suggest (e.g., via a text message or email or the like) one or more of these actions to an admin user, in response to which controller 110 may execute those actions once controller 110 receives an affirmative reply (e.g., a reply text message or email that includes an affirmative response).

Controller 110 may communicate with remote computer 130 over network 140. Network 140 may include a computing network over which computing messages may be sent and/or received. For example, network 140 may include the Internet, a local area network (LAN), a wide area network (WAN), a wireless network such as a wireless LAN (WLAN), or the like. Network 140 may comprise copper transmission cables, optical transmission fibers, wireless transmission, routers, firewalls, switches, gateway computers and/or edge servers. A network adapter card or network interface in each computing/processing device (e.g., controller 110, target system 120, and remote computer 130) may receive messages and/or instructions from and/or through network 140 and forward the messages and/or instructions for storage or execution or the like to a respective memory or processor of the respective computing/processing device.

Though network 140 is depicted as a single entity in FIG. 1A for purposes of illustration, in other examples network 140 may include a plurality of private and/or public networks. For example, controller 110 and remote computer 130 may communicate together over a private WLAN of network 140, while target system 120 and remote computer 130 may communicate together over a private LAN of network 140, etc.

Flexible curtain 112 may be deployed to a deployed configuration such that flexible curtain 112 extends across some or all of an operational face of target system 120. Further, flexible curtain may be stowed in a stowed configuration to expose the operational face of target system 120. Flexible curtain 112 may be configured to actuate to move between this deployed and stowed configuration repeatedly without damage to flexible curtain 112 (e.g., such that flexible curtain 112 does not incur stress damage by being condensed into the stowed configuration or being extended into the deployed configuration).

Figure 1B:
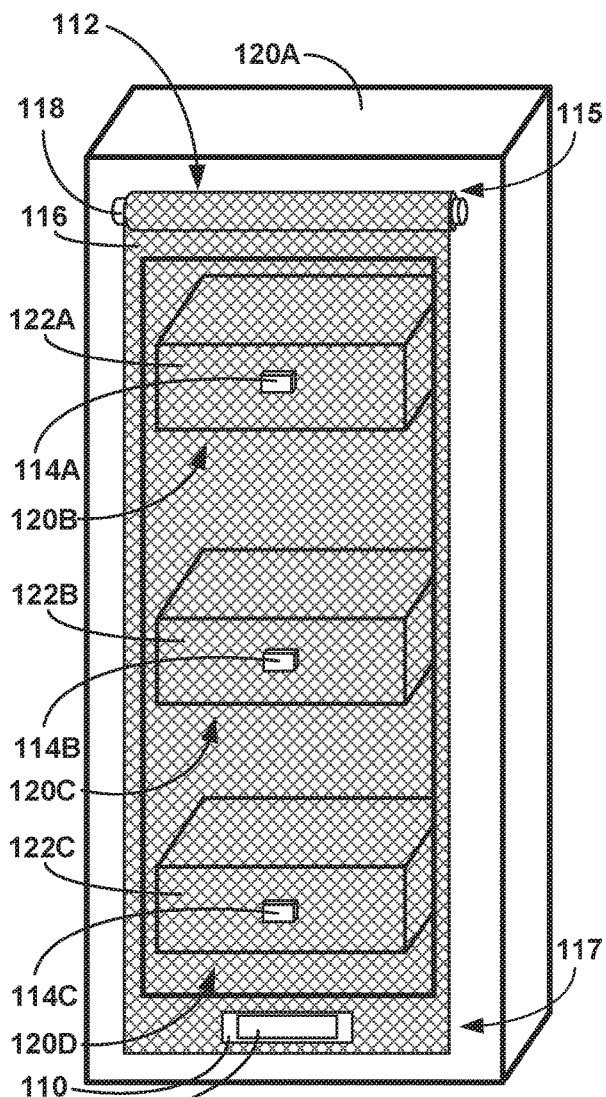
FIG. 1B depicts an isometric view of an example flexible curtain in a deployed configuration relative to an example target system.
Figure 1C:
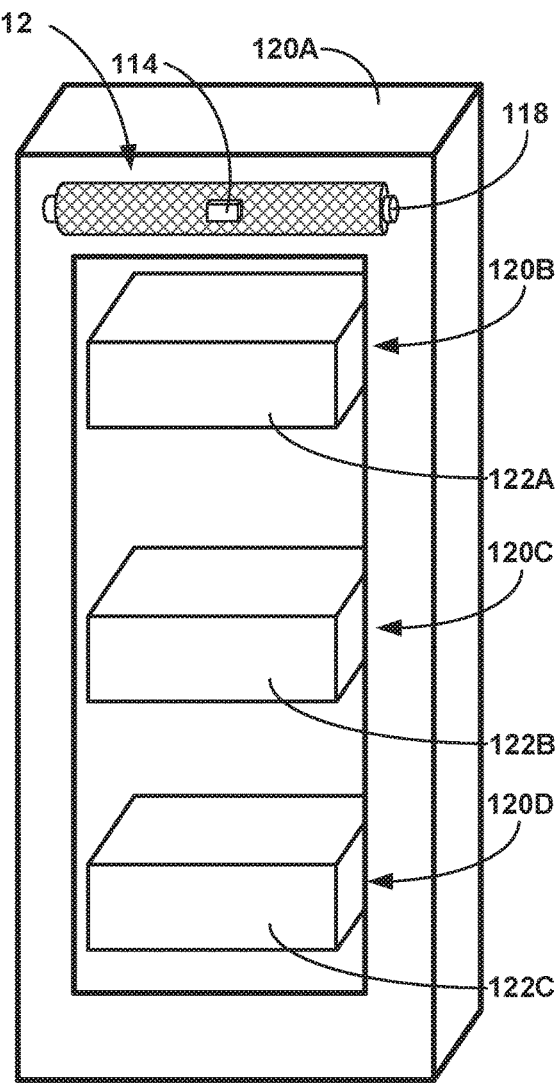
FIG. 1C depicts an isometric view of the flexible curtain of FIG. 1B in a stowed configuration relative to the target system via an example rod that remains stationary while the flexible curtain rolls around the rod.

For example, FIG. 1B depicts flexible curtain 112 defining a deployed configuration across target system 120, and FIG. 1C depicts flexible curtain 112 defining a stowed configuration across the same target system 120. As depicted, target system 120 includes a server closet 120A with a plurality of rack servers 120B, 120C, 120D (all of which collectively refer to target system 120). In other examples, target system 120 may only refer to server closet 120A and/or one or multiple rack servers 120B, 120C, 120D. A relative size and configuration of flexible curtain 112, server closet 120A, and rack servers 120B, 120C, 120D of target system 120 as depicted in FIGS. 1B and 1C is provided for purposes of illustration only, and relative sizes and configurations that are consistent with this disclosure are contemplated. Further, many elements of FIGS. 1B and 1C may define different relative sizes, such as rack servers 120B, 120C, 120D which may be substantially thinner in other examples (and may be far more condensed within server closet 120A) but are depicted as relatively thick (and spaced apart) for purposes of clarity.

Flexible curtain 112 may define major surface 116. Major surface 116 may be a substantially planar surface that can bend and curve due to the flexible nature of flexible curtain 112. Flexible curtain 112 may define major surface 116 to be substantially any size based on a size of target system 120. For example, if server closet 120A is six feet tall and two feet wide, flexible curtain 112 may define major surface 116 that is five feet long and twenty inches wide (e.g., such that major surface 116 can extend across most of server closet 120A). In other examples, major surface 116 may define a size that is substantially similar to, or bigger than, a size of target system 120.

As depicted in FIG. 1B, flexible curtain 112 may be transparent. Flexible curtain 112 may be transparent or translucent as a result of flexible curtain 112 including a mesh with a plurality of holes that extend through major surface 116 of flexible curtain 112. For example, flexible curtain 112 may be made of a wire mesh or a fabric mesh that defines a plurality of holes through major surface 116. In other example, flexible curtain 112 may be transparent or translucent as a result of a material of flexible curtain 112. For example, flexible curtain 112 may be made of a transparent or translucent polymer. In other examples (not depicted), flexible curtain 112 may block light rather than being transparent or translucent, such that it may be difficult and/or impossible to see through major surface 116 of flexible curtain 112.

As discussed herein, flexible curtain 112 may be relatively flexible such that flexible curtain 112 may be repeatedly bent and contorted without any lasting damage to flexible curtain 112. For example, as depicted in FIG. 1C, flexible curtain 112 may be rolled around rod 118 to define stowed configuration without damage to flexible curtain 112. In other examples, flexible curtain 112 may be folded, twisted, or otherwise condensed in any way toward a predetermined edge 115 of flexible curtain 112 to define a stowed configuration.

In some examples, controller 110 may cause actuation/movement between a deployed and stowed configuration by electromechanical means. For example, controller 110 may cause rod 118 to roll in a clockwise or counter-clockwise fashion to deploy or stow flexible curtain 112. Controller 110 may deploy and/or stow flexible curtain 112 in response to a command provided by a user (e.g., a detected voice command, or a command provided via remote computer 130, or the like). Alternatively, controller 110 may deploy and/or stow flexible curtain 112 in response to detected stimuli such as an operator walking up to target system 120 as detected by a proximity sensor. In other examples, actuation and/or movement of flexible curtain 112 may be manual, such that an operator may, e.g., manually roll rod 118 to deploy and/or stow flexible curtain 112.

As depicted, flexible curtain 112 defines a deployed configuration such that sensors 114A-114C (collectively, "sensors 114") are oriented to sense conditions from operational faces 122A-122C (collectively, "operational faces 122") of target system 120. As used herein, operational faces 122 may include one or more surfaces of target system 120 at which the conditions discussed herein are best sensed by sensors 114 (e.g., such that conditions are most accurate and repeatable when measured from that surface). Further, operational faces 122 may include a surface of target system 120 that is primarily and/or initially handled when providing manual operation and/or maintenance to target system 120 (e.g., such that attachment mechanisms, release mechanisms, manual controls, or the like are on and/or near operational faces 122). As depicted, when flexible curtain 112 defines a stowed configuration, flexible curtain 112 exposes operational faces 122 of target system 120.

As depicted in the figures, flexible curtain 112 includes three sensors 114, though flexible curtain 112 may include any number of sensors 114 that is consistent with this disclosure. In some examples, flexible curtain 112 includes a relatively small set of sensors 114 that controller 110 is configured to move across major surface 116 of flexible curtain 112 to move to new sensor attachment locations as discussed herein. For example, flexible curtain may define a single sensor 114 for each condition to be measured for each of operational faces 122. In other examples, flexible curtain 112 may define a plurality of sensors 114 that are adjacent each of operational faces 122 at different sensor attachment locations. In such examples, controller 110 may turn off a first sensor 114 at a first sensor attachment location that is adjacent a first operational face 122, where this first sensor 114 is measuring a first condition of the first operational face 122, and subsequently turn on a second sensor 114 at a second sensor attachment location that is adjacent the first operational face 122 to measure the first condition of the first operational face 122.

Flexible curtain 112 may be attached to any side of target system 120 that enables sensors 114 of flexible curtain 112 to monitor target system 120. For example, flexible curtain 112 may be attached to a front or a back of server closet 120A. In other examples (not depicted), flexible curtain 112 may include a self-supporting structure that may be located adjacent operational faces 122 of target system 120 (rather than attached to target system 120).

Flexible curtain 112 may be attached to target system 120 (e.g., through rod 118 or other means) to define a straight-line distance between major surface 116 and operational surfaces 122 that sensors 114 may detect conditions. In some examples, controller 110 may be secured to flexible curtain 112 near longitudinal edge 117 that is closest to the ground to weigh down flexible curtain 112 (e.g., so that flexible curtain 112 does not substantially billow or otherwise move in response to air movement, incidental contact, or the like within the environment). Controller 110 may be secured to flexible curtain 112 at longitudinal edge 117 that is opposite predetermined edge 115 toward which flexible curtain 112 condenses to define the stowed configuration. In some examples, a power supply that is utilized to power some or all operations of controller 110 and/or flexible curtain 112 may be secured to flexible curtain 112 near longitudinal edge 117 to further weigh down flexible curtain 112. Additionally, or alternatively, flexible curtain 112 may be secured alongside sides of major surface 116 to target system 120 by suction cups, Velcro scraps, hooks, or the like. Securing flexible curtain 112 in a fixed position relative to target system 120 in such ways may improve an accuracy and repeatability of conditions as sensed by sensors 114 (e.g., by eliminating or reducing a variable of distance between sensors 114 and the relevant operational surfaces 122).

In some examples, controller 110 may present some condition information gathered by sensors 114 on display 150. For example, controller 110 may generate information related to which sensors 114 are detecting what conditions, what the current conditions are, what historical conditions have been, or the like. Display 150 may be secured to a bottom of flexible curtain 112 near longitudinal edge 117 to weigh down flexible curtain 112 as described herein. In other examples, display 150 may be attached to rod 118, target system 120, or to other components at other locations. In certain examples, display 150 may be woven into or otherwise made part of major surface 116 of flexible curtain 112. Display 150 may include one or more light emitting diodes (LEDs) that indicate various statuses and information. In some examples, display 150 may include an organic LED (OLED) screen that is configured to provide specific readings or the like. Display 150 may be a touch screen, or may otherwise be configured to receive inputs from a user, such that display 150 may be configured to alter what information is generated on display 150 in response to prompts. In some examples, a user may able to modify a utilization of flexible curtain 112 (e.g., such as by moving flexible curtain 112 from a stowed configuration to a deployed configuration, or vice versa) by entering one or more prompts into display 150.

Figure 1D:
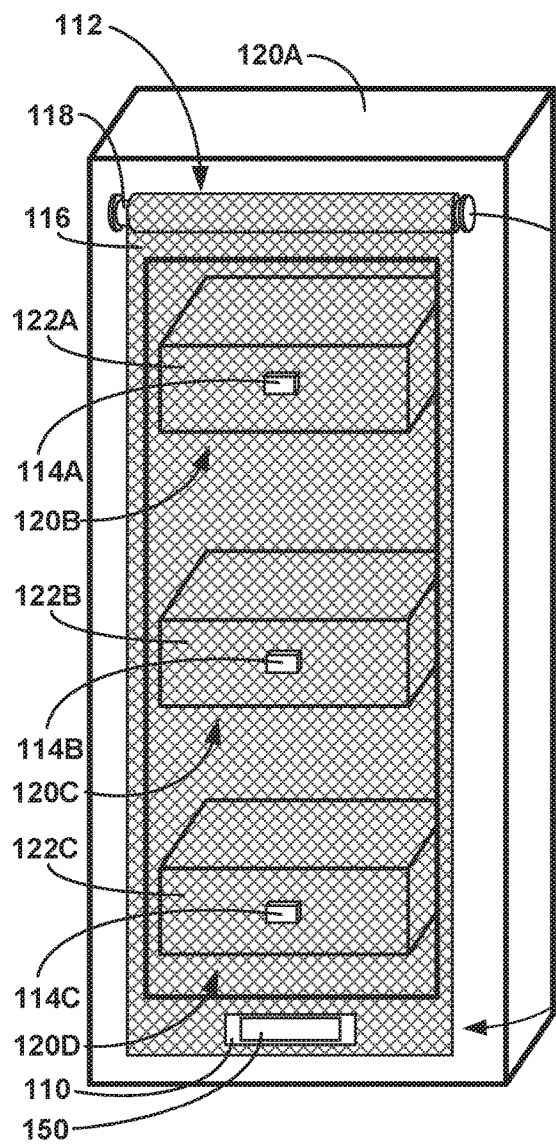
FIG. 1D depicts an isometric view of an example flexible curtain in a deployed configuration relative to an example target system.
Figure 1E:
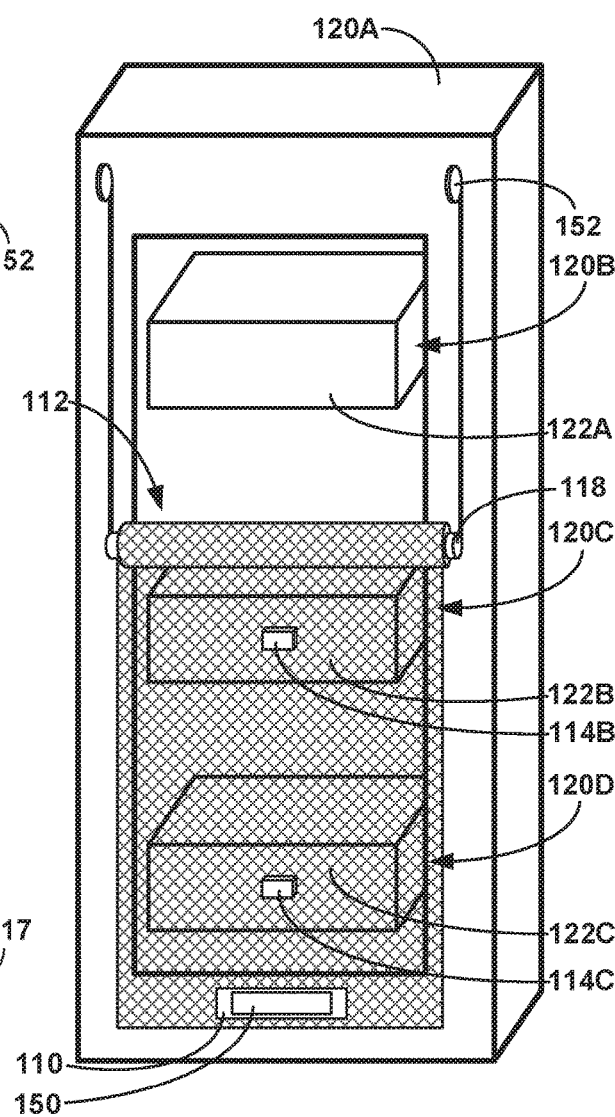
FIG. 1E depicts an isometric view of the flexible curtain of FIG. 1D in a stowed configuration relative to the target system via an example rod that moves toward an end of the target station while the flexible curtain rolls around the moving rod.

In some examples, flexible curtain 112 may be configured to define stowed and deployed configurations at different locations relative to target system 120. For example, as depicted in FIGS. 1D and 1E, flexible curtain 112 may configured to roll around rod 118, which is itself configured to be moved between a top and bottom end of target system 120. Pulley mechanism 152 may be secured to both longitudinal ends of rod 118 to move rod 118 towards the respective top and bottom ends of target system 120. Pulley mechanism 152 may be spring-loaded, or operated by any other electro-mechanical means. Pulley mechanism 152 may be configured to roll rod 118 as rod 118 extends toward a bottom end of target system 120, such that rod 118 rolls up flexible curtain 112 as pulley mechanism 152 moves rod 118 towards the bottom end of target system 120.

In some examples pulley mechanism 152 may be manually operated, such that a human operator uses pulley mechanism 152 to move rod 118 towards a top or bottom of target system 120. Alternatively, or additionally, controller 110 may be configured to control pulley mechanism 152, such that controller 110 may cause pulley mechanism 154 to position rod 118 near a top of target system 120 or at any other location. For example, as depicted in FIG. 1E, pulley mechanism 152 is positioning rod 118 such that operational surface 122A is exposed while operational surfaces 122B, 122C are still being monitored by sensors 114B, 114C.

Figure 1F:
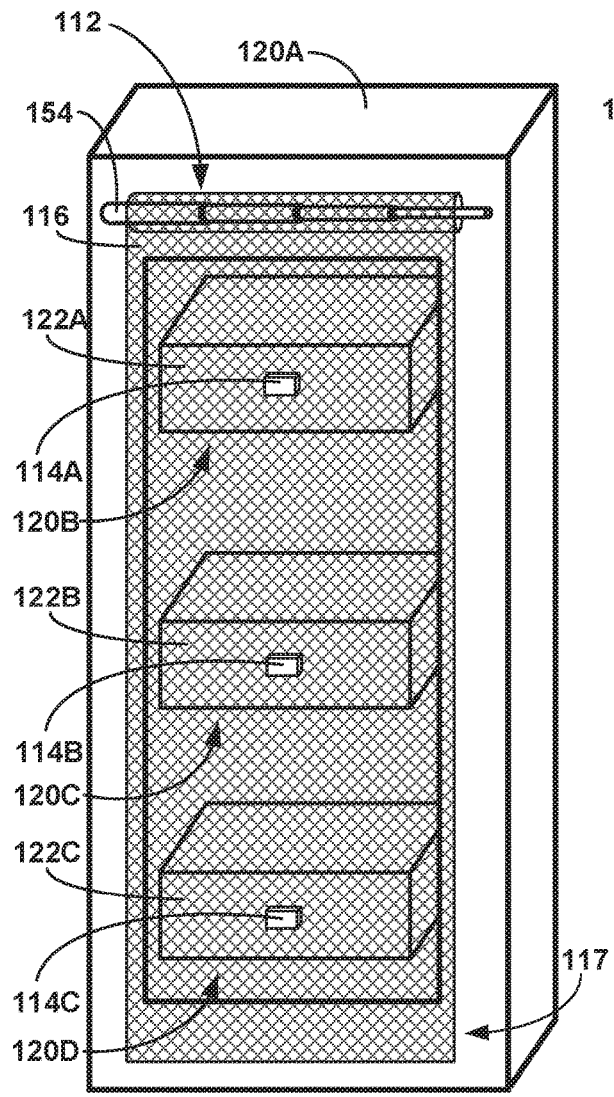
FIG. 1F depicts an isometric view of an example flexible curtain in a deployed configuration relative to an example target system.
Figure 1G:
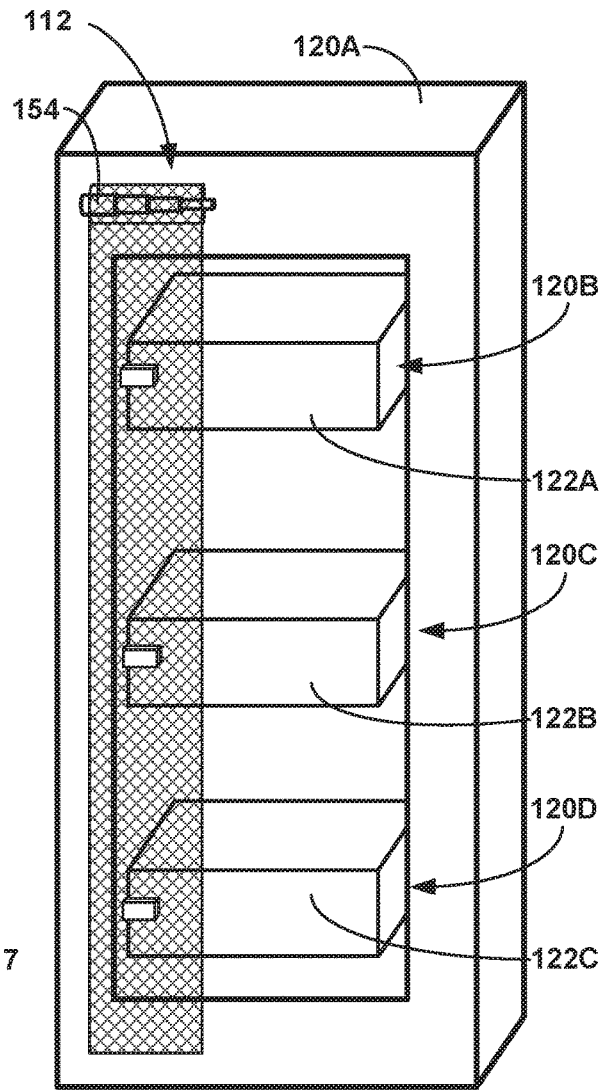
FIG. 1G depicts an isometric view of the flexible curtain of FIG. 1F in a stowed configuration relative to the target system via an example telescopic rod that condenses toward one side of the target system.

For another example of how flexible curtain 112 may define different stowed and deployed configurations, as depicted in FIGS. 1F and 1G, flexible curtain 112 may secured to telescopic rod 154 that is configured to longitudinally condense and extend to define a stored and deployed configuration. Controller 110 and display 150 are not depicted in FIGS. 1F and 1G for purposes of clarity. Telescopic rod 154 may be configured to condense toward a predetermined side (e.g., a left or right side) of target system 120. Flexible curtain 112 may be secured to telescopic rod 154 such that telescopic rod 154 extends flexible curtain 112 toward whichever.

In some examples telescopic rod 154 may be manually operated, such that a human operator may condense or extend telescopic rod 154 toward either side of target system 120. Alternatively, or additionally, controller 110 may be configured to control telescopic rod 154, such that controller 110 may cause telescopic rod 154 to position flexible curtain 112 closer to one side of target system 120 or arranged across all operational surfaces 122 of target system. For example, as depicted in FIG. 1G, telescopic rod 154 is positioning flexible curtain 112 such that all operational surfaces 122 are substantially exposed.

Though FIGS. 1F and 1G do not depict pulley mechanism 152 or flexible curtain 112 rolling around telescopic rod 154, in some examples each of these embodiments may be combined together. For example, flexible curtain 112 may include an assembly that includes both telescopic rod 154 and pulley mechanism 152, such that flexible curtain 112 may be rolled near a top surface of target system 120, pulled (via telescopic rod 154) toward a predetermined side of target system 120, and rolled around telescopic rod 154 toward a bottom end of target system 120 (as lowered by pulley mechanism 152) at the same or different times.

Controller 110 may move sensors 114, turn sensors 114 on, and/or turn sensors 114 to adjust the monitoring such that conditions are monitored from preferred sensor attachment locations. For example, controller 110 may analyze conditions as sensed by sensors 114 at given sensor attachment locations and compare these measured conditions against a utilization and/or performance of target system 120 (e.g., where controller 110 receives workload information on target system 120 through network 140). Where controller 110 determines that, e.g., an increased utilization of target system 120 does not correspond with accompanying changes in conditions (e.g., increased temperatures), controller 110 may adjust sensors 114 to better capture accurate and repeatable conditions. Controller 110 may adjust sensors 114 by changing a location of one or more sensors 114, turning off a first sensor 114 at a first location and turning on a second sensor 114 at a second location, switching from one type of sensor 114 to another type of sensor 114, requesting a replacement sensor 114, or the like.

For example, FIGS. 2A and 2B depict telescopic bar 160 to which sensors 114 may be secured. In some examples sensors 114 may be secured to telescopic bar 160 at substantially any location along telescopic bar 160, though in other examples telescopic bar 160 may define a predetermined number of sensor attachment locations at which sensors 114 may be secured to telescopic bar 160. Sensors 114 may be secured to telescopic bar 160 through any means, such as via screws, interference fits, straps, computer ports (e.g., such as a universal serial bus (USB) port) into which sensors 114 may be inserted and electrically coupled to telescopic bar 160, or the like. Though only one sensor 114 is depicted as secured to telescopic bar 160 for purposes of illustration, in other examples two or three or more sensors 114 may be secured to telescopic bar 160. In some examples, all sensors 114 secured to telescopic bar 160 may measure the same conditions, whereas in other examples different sensors 114 measure different conditions.

Telescopic bar 160 may be secured to flexible curtain 112 through one or more straps 170A, 170B, 170C (collectively, "straps 170") defined by flexible curtain 112. Telescopic bar 160 may fit relatively snugly within straps 170 such that it is unlikely that telescopic bar 160 will accidentally and/or unintentionally move as placed within straps 170, even when actuating flexible curtain 112 to move between a stowed and deployed configuration. Though sensors 114 are depicted in FIGS. 2A and 2B as relatively large for purposes of clarity, it is to be understood that in reality sensors 114 may be relatively small. As such, in some examples sensors 114 may be moved through straps 170 without snagging when telescopic bar 160 extends and/or condenses.

As depicted, telescopic bar 160 may be configured to extend and/or condense along a longitudinal axis of telescopic bar 160. Controller 110 may control how and if telescopic bar 160 extends and condenses. For example, as depicted in FIG. 2B, controller 110 may cause telescopic bar 160 to condense in direction 164 away from one edge of flexible curtain 112 and toward another edge such that sensor 114 moves from one sensor attachment location to a second sensor attachment location. Controller 110 may control the actuation of telescopic bar 160 through electromechanical means, such as via stepper motors or servo motors or the like within or adjacent to telescopic bar 160.

In some examples, telescopic bar 160 may be configured to rotate relative to flexible curtain 112. Controller 110 may control this rotation to change a location of sensors 114. For example, as depicted in FIG. 2B, controller 110 may cause telescopic bar 160 to rotate in direction 162 to reposition sensor 114 to a new sensor attachment location.

Telescopic bar 160 and/or sensors 114 may both be powered by a power source of controller 110 as described above. In such examples, telescopic bar 160 may be plugged into this power source when secured to flexible curtain 112 via straps 170, and the act of securing sensors 114 to telescopic bar 160 may also functionally provide power to sensors 114. Flexible curtain 112 may include one or more power supplying wires embedded within major surface 116 that extend longitudinally through major surface 116 that may be plugged into telescopic bar 160 to provide power to telescopic bar 160 and/or sensors 114. In other examples, one or both of telescopic bar 160 and/or sensors 114 may be powered via internal respective power sources, such that one or both do not require being coupled to a power source of flexible curtain 112 and/or controller 110.

Controller 110 may gather condition data from sensors 114 of telescopic bar 160 as described herein on target system 120 to monitor target system 120. In some examples, controller 110 may communicate with telescopic bars 160 to gather condition data from sensors 114. For example, two or more telescopic bar 160 may be coupled to controller 110 in series, in parallel, as a mash topology, or the like to be read by controller 110. As discussed herein, controller 110 may communicatively couple with telescopic bars using various methods (e.g. bayonet lock, screw lock, cable plug-in connection, optical connections, wireless connections such as LPWAN, Bluetooth or WiFi, Zigbee, 5G etc.).

In other examples, controller 110 may utilize sensors 114 attached to frames that define shapes other than straight lines, whether rectangles, triangles, pentagons, or any other shape on major surface 116. For example, sensors 114 may be attached to flexible frames that may be configured to assume substantially any shape.

Figure 2C:
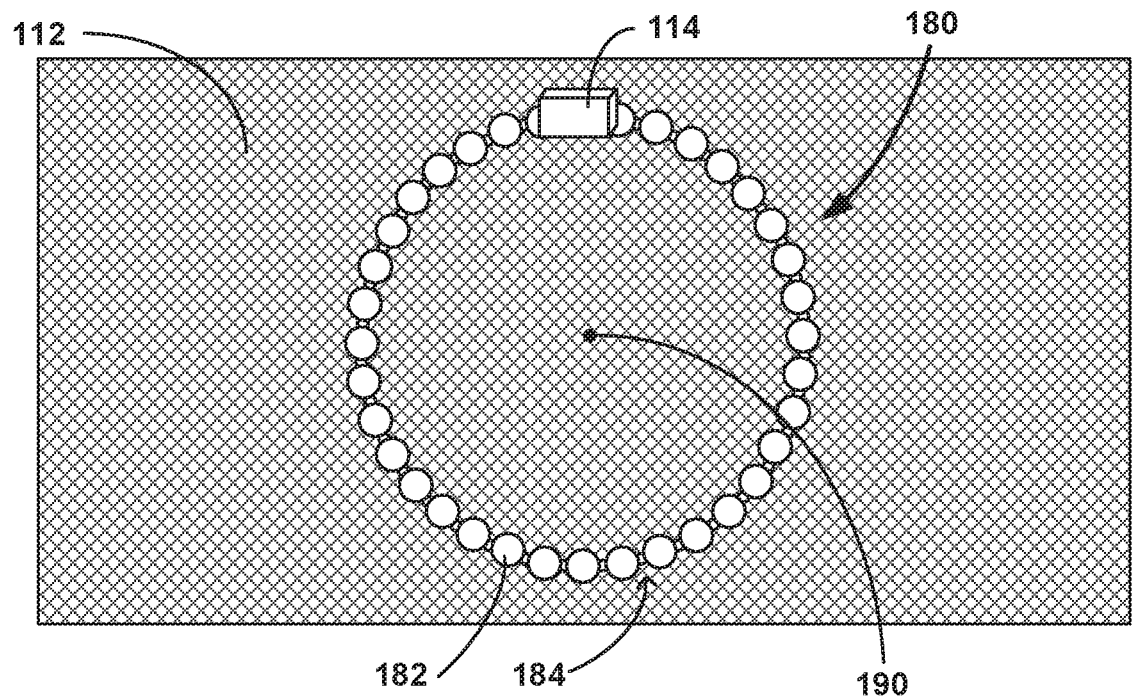
FIG. 2C depicts a sensor attached to a circular flexible frame of a flexible curtain such that the sensor is at a third attachment location.
Figure 2D:
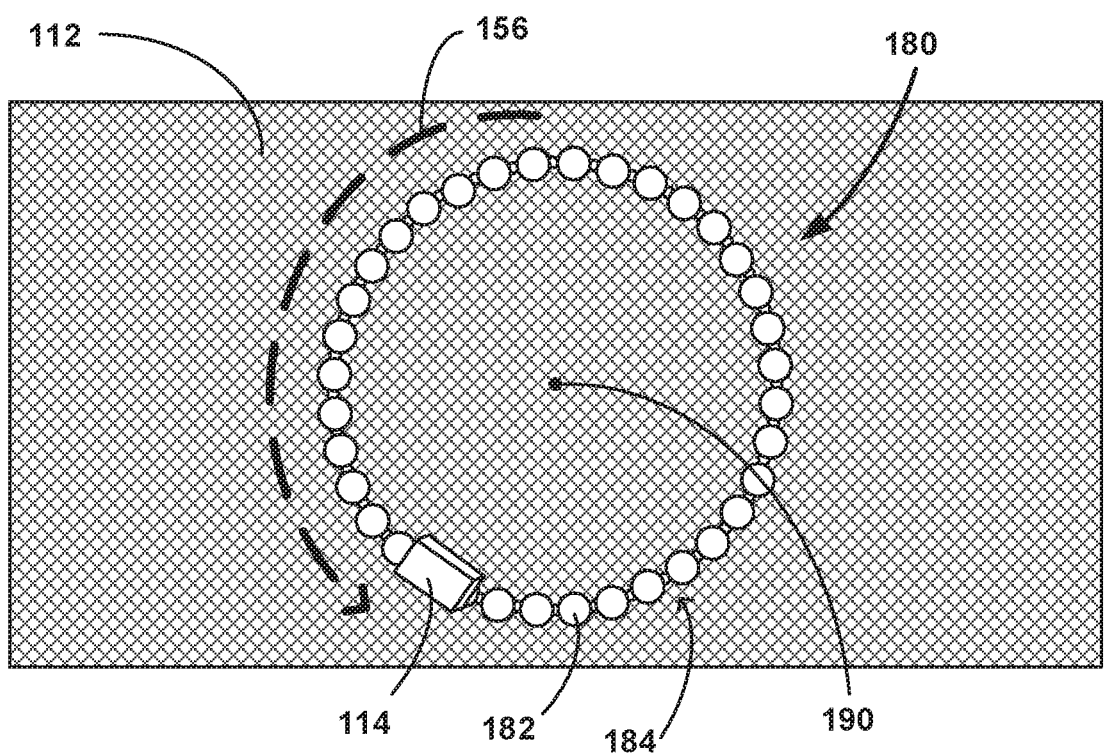
FIG. 2D depicts the circular flexible frame of FIG. 2C rotated relative to a fixed point of the flexible curtain such that the sensor is at a fourth attachment location.

FIGS. 2C and 2D depict sensor 114 as attached to flexible frame 180 which is depicted as defining a circle shape on flexible curtain 112. Flexible frame 180 may be attached to flexible curtain 112 in substantially any means consistent with this disclosure, such as straps 170 discussed herein, pins (e.g., safety pins), or the like. Flexible frame 180 may be configured to define shapes on major surface 116 of flexible curtain 112 as a result of series of ball joints that comprise flexible frame 180, where balls 182 are coupled together by moveable pins 184. Other means that enable flexible frame 180 to define a plurality of shapes are also possible. Flexible frame 180 may be configured to hold a shape even as flexible frame 180 is condensed along with flexible curtain 112 into the stowed configuration and then actuated/moved back to the deployed configuration.

Similar to telescopic bars 160 above, flexible frame 180 may define a predetermined plurality of sensor attachment locations (e.g., via a finite number of USB ports), or flexible frame 180 may be configured such that sensor 114 may attach to flexible frame 180 at substantially any location. Sensor 114 may electrically couple to flexible frame 180 when secured to flexible frame 180 as described above.

In some examples, flexible frame 180 may be actuatable as controlled by controller 110. For example, controller 110 may be configured to rotate flexible frame in direction 156 relative to fixed point 190 of flexible curtain 112 to move sensor 114. In other directions, controller 110 may further be configured to cause flexible frame 180 to define different shapes. In some examples, controller 110 may be able to identify a location of sensor 114 relative to flexible curtain 112 to improve an ability to move sensors 114 to more efficient locations as described herein. Enabling sensor 114 to be moved by moving flexible frame 180 may improve an ability of controller 110 to improve an efficiency of sensors 114 in detecting conditions of target system 120.

Controller 110 may cause flexible frame 180 to rotate via any mechanism consistent with this disclosure. For example, controller 110 may cause one or more spokes (not depicted) that are secured to fixed point 190 and extend from fixed point 190 to flexible frame 180 to rotate relative to flexible curtain 112. Controller 110 may cause these spokes to rotate via electromechanical means as described herein. Alternatively, or additionally, controller 110 may pull or push a stiff circular wire (not depicted) or the like that is attached to flexible frame 180 clockwise or counterclockwise to cause flexible frame 180 to rotate (e.g., where both flexible frame 180 and a flexible wire are secured to flexible curtain 112 within a series of loops or the like.

As described above, controller 110 may include a processor configured to execute instructions stored on a memory to execute the techniques described herein. For example, FIG. 3 is a conceptual box diagram of such computing device of controller 110. While controller 110 is depicted as a single entity (e.g., within a single housing) for the purposes of illustration in FIG. 3, as described above in other examples the components of controller 110 may be stored within two or three or more discrete physical housings Controller 110 may include interface 210, processor 220, and memory 230. Controller 110 may include any number or amount of interface(s) 210, processor(s) 220, and/or memory(s) 230.

Controller 110 may include components that enable controller 110 to communicate with (e.g., send data to and receive and utilize data transmitted by) devices that are external to controller 110. For example, controller 110 may include interface 210 that is configured to enable controller 110 and components of controller 110 (e.g., such as processor 220) to communicate with entities external to controller 110. Specifically, interface 210 may be configured to enable components of controller 110 to communicate with sensors 114, target system 120, remote computer 130, telescopic bars 160, flexible frames 180, or the like. Interface 210 may include one or more network interface cards, such as Ethernet cards, and/or any other types of interface devices that can send and receive information. Any suitable number of interfaces may be used to perform the described functions according to particular needs.

As discussed herein, controller 110 may be configured to monitor target system 120 using flexible curtain 112. Controller 110 may utilize processor 220 to monitor target system 120 as discussed herein. Processor 220 may include, for example, microprocessors, digital signal processors (DSPs), application specific integrated circuits (ASICs), field-programmable gate arrays (FPGAs), and/or equivalent discrete or integrated logic circuits. Two or more of processor 220 may be configured to work together to utilize sensors 114 of flexible curtain 112 to monitor target system 120.

Processor 220 may monitor target system 120 by executing the operations described herein according to instructions 232 stored on memory 230 of controller 110. Memory 230 may include a computer-readable storage medium or computer-readable storage device. In some examples, memory 230 may include one or more of a short-term memory or a long-term memory. Memory 230 may include, for example, random access memories (RAM), dynamic random-access memories (DRAM), static random-access memories (SRAM), magnetic hard discs, optical discs, floppy discs, flash memories, forms of electrically programmable memories (EPROM), electrically erasable and programmable memories (EEPROM), or the like. In some examples, processor 220 may monitor target system 120 using flexible curtain 112 as described herein according to instructions 232 of one or more applications (e.g., software applications) stored in memory 230 of controller 110.

In addition to instructions 232, in some examples gathered or predetermined data or techniques or the like as used by processor 220 to monitor target system 120 may be stored within memory 230. For example, as depicted in FIG. 3, memory 230 may include sensor data 234, which may include both condition data 236 and location data 238. Sensor data 234 may include identification of each given sensor 114 secured to flexible curtain 112, whether or not these sensors 114 are currently activated and/or monitoring target system 120. Condition data 236 may include data that has been gathered by sensors 114. In some examples, condition data 236 may further include an efficiency of this condition data 236, where such an efficiency relates to an extent to which gathered condition data 236 corresponds with usage data of the target system 120. Location data 238 may include two-dimensional data regarding where sensor 114 is on major surface 116, data regarding which bar and/or frame respective sensors 114 are secured to, or the like.

In some examples, memory 230 may also include threshold data 240. Threshold data 240 may include one or more thresholds related to one or more operations, such as a threshold at which an alert is to be generated or transmitted. For example, threshold data 240 may include a temperature condition at which controller 110 transmits an alert to remote computer 130 (e.g., as the temperature indicates that target system 120 is operating at a temperature at which components may fail and/or become damaged). For another example, threshold data 240 may include a radiation condition at which controller 110 transmits an alert to a plurality of remote computers 130 (e.g., as a leaked radiation as detected indicates a safety hazard).

Alternatively, or additionally, threshold data 240 includes thresholds at which controller 110 may move one or more sensors 114. For example, if a detected condition tracks with a utilization of target system 120 below an efficiency threshold, controller 110 may move this sensor 114 (e.g., by extending telescopic bar 160, rotating flexible frame 180, or causing flexible frame 180 to define a different shape). For another example, if a condition is not sensed prior to a failure or warning of target system 120 (e.g., where said failure or warning might have been preceded by a detectable condition), controller 110 may move sensors 114.

Memory 230 may further include machine learning techniques 242 that controller 110 may use to improve a process of controlling sensors 114 and/or generating alerts regarding detected conditions. Machine learning techniques 242 can comprise algorithms or models that are generated by performing supervised, unsupervised, or semi-supervised training on a dataset, and subsequently applying the generated algorithm or model to move sensors 114 and/or generate alerts.

Machine learning techniques 242 can include, but are not limited to, decision tree learning, association rule learning, artificial neural networks, deep learning, inductive logic programming, support vector machines, clustering, Bayesian networks, reinforcement learning, representation learning, similarity/metric training, sparse dictionary learning, genetic algorithms, rule-based learning, and/or other machine learning algorithms.

For example, the machine learning techniques 242 can utilize one or more of the following example techniques: K-nearest neighbor (KNN), learning vector quantization (LVQ), self-organizing map (SOM), logistic regression, ordinary least squares regression (OLSR), linear regression, stepwise regression, multivariate adaptive regression spline (MARS), ridge regression, least absolute shrinkage and selection operator (LASSO), elastic net, least-angle regression (LARS), probabilistic classifier, naïve Bayes classifier, binary classifier, linear classifier, hierarchical classifier, canonical correlation analysis (CCA), factor analysis, independent component analysis (ICA), linear discriminant analysis (LDA), multidimensional scaling (MDS), non-negative metric factorization (NMF), partial least squares regression (PLSR), principal component analysis (PCA), principal component regression (PCR), Sammon mapping, t-distributed stochastic neighbor embedding (t-SNE), bootstrap aggregating, ensemble averaging, gradient boosted decision tree (GBRT), gradient boosting machine (GBM), inductive bias algorithms, Q-learning, state-action-reward-state-action (SARSA), temporal difference (TD) learning, apriori algorithms, equivalence class transformation (ECLAT) algorithms, Gaussian process regression, gene expression programming, group method of data handling (GMDH), inductive logic programming, instance-based learning, logistic model trees, information fuzzy networks (IFN), hidden Markov models, Gaussian naïve Bayes, multinomial naïve Bayes, averaged one-dependence estimators (AODE), Bayesian network (BN), classification and regression tree (CART), chi-squared automatic interaction detection (CHAID), expectation-maximization algorithm, feed-forward neural networks, logic learning machine, self-organizing map, single-linkage clustering, fuzzy clustering, hierarchical clustering, Boltzmann machines, convolutional neural networks, recurrent neural networks, hierarchical temporal memory (HTM), and/or other machine learning algorithms.

Figure 4:
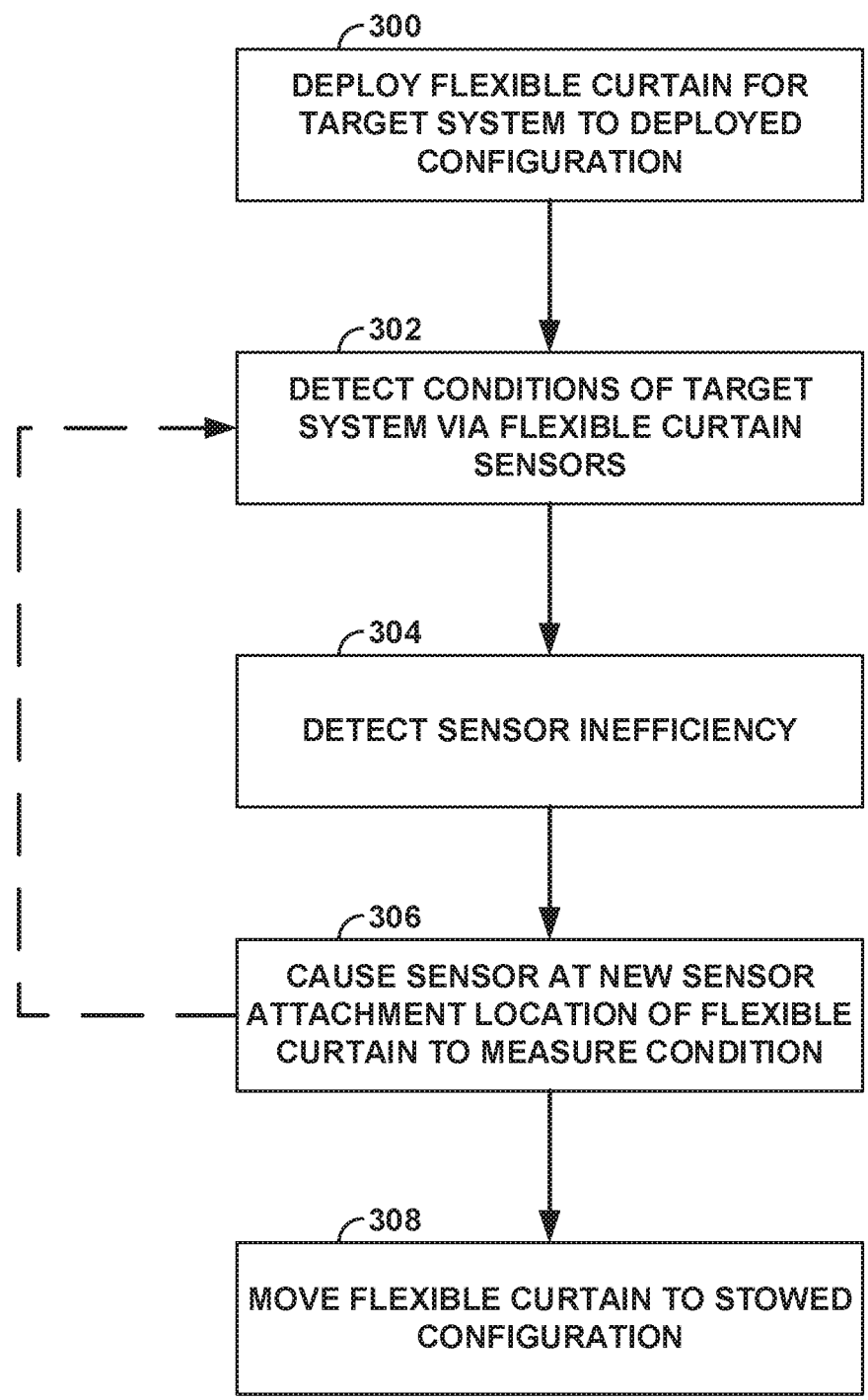
FIG. 4 depicts an example flowchart of a controller using sensors of a flexible curtain to monitor a target system consistent with embodiments of this disclosure.

Using these components, controller 110 monitors target system 120 using flexible curtain 112 as discussed herein. For example, controller 110 may execute these steps according to the flowchart depicted in FIG. 4. The flowchart of FIG. 4 is discussed with relation to the systems and components of FIGS. 1A-2D for purposes of illustration, though it is to be understood that other systems and components may be used to execute the flowchart of FIG. 4 in other examples. Further, in some examples the systems described herein may execute a different method than the flowchart of FIG. 4, or the systems described herein may execute a similar method with more or less steps, or similar steps in a different order, or the like.

As depicted in FIG. 4, flexible curtain 112 is deployed into the deployed configuration of FIG. 1B (300). In some examples, flexible curtain 112 may be manually deployed, whereas in other examples controller 110 may deploy flexible curtain 112. Controller 110 may deploy flexible curtain 112 by unrolling rod 118 around which flexible curtain 112 and sensors 114 (e.g., and telescopic bars 160 and/or flexible frames 180) are condensed prior to deployment. Alternatively, controller 110 may deploy flexible curtain 112 by extending a telescopic rod, or any other form of deployment that is consistent with this disclosure.

Sensors 114 of flexible curtain detect conditions of target system 120 (302). For example, sensors 114 may detect a temperature condition of target system 120. Controller 110 detects an inefficiency of the detected condition (304). For example, controller 110 may detect that a condition as detected by sensor 114 does not track with a utilization of processing cores of target system 120 (e.g., where processing cores are highly utilized, such that a detected temperature condition should be higher than was detected by sensor 114).

Controller 110 may identify a different sensor attachment location at which sensors 114 may detect this condition. Controller 110 may determine that the new sensor attachment location can relatively more efficiently (e.g., accurately and repeatably) measure an efficiency of a condition. In some examples, controller 110 may determine this as part of a trial-and-error method, where, e.g., controller 110 continues identifying new and untested sensor attachment locations for sensor 114 until a gathered condition matches the utilization of target system 120. In other examples, controller 110 may utilize machine learning techniques to identify possible efficient sensor attachment locations by, e.g., tracking which relative sensor attachment locations are efficient for previous target systems 120 as measures by respective previous sensors 114. In some examples, controller 110 may integrate this historical data with a corpus of data such as studies on various locations as gathered over network 140. Other examples of how controller 110 may identify a new sensor attachment location that are consistent with this disclosure are also possible.

In response to this detected inefficiency, controller 110 may cause sensor 114 at the determined new sensor attachment location to measure the condition (306). Controller 110 may cause the same sensor 114 to move to the new sensor attachment location, and/or controller 110 may turn off a first sensor 114 that was measuring the condition at the suboptimal sensor attachment location and turn on a second sensor 114 that is already attached to flexible curtain 112 at the new sensor attachment location. For example, flexible curtain 112 may include a plurality of sensors 114 that are each secured to flexible curtain 112 at discrete sensor attachment locations, and are each configured to measure a single condition for a single operational face 122. In this example, controller 110 may turn on different sensors 114 at different sensor attachment locations based on how these sensors 114 at different locations are detected various conditions.

Alternatively, or additionally, as discussed above controller 110 may move a single sensor 114 between two sensor attachment locations of flexible curtain 112. For example, controller 110 may move a selected sensor 114 from the initial sensor attachment location at which the condition was inefficiently gathered to the new sensor attachment location that controller 110 identifies is more likely to efficiently sense the condition. Controller 110 may move sensor 114 by extending or condensing telescopic bar 160, and/or controller 110 may move sensor 114 by rotating flexible frame 180. Controller 110 may continue to evaluate detected conditions (302) and move sensors (306) if any further inefficiencies are detected (304).

Flexible curtain 112 is moved to the stowed configuration (308). Flexible curtain 112 may be moved to the stowed configuration manually by a user. Alternatively, or additionally, controller 110 may move flexible curtain 112 to the stowed configuration. Controller 110 may move flexible curtain 112 to the stowed configuration in response to detecting a user walking up to target system 120.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A system comprising:
   a flexible curtain that defines a major surface and is configured to repeatedly actuate to move between a deployed configuration and a stowed configuration;
   a first sensor configured to detect a first condition and removably attached to a first sensor attachment location; and
   a second sensor configured to detect a second condition and removably attached to a second sensor attachment location, wherein:
   the major surface extends across an operational surface of a target system such that the first and second sensors detect the first and second conditions of the target system when the flexible curtain defines the deployed configuration;
   the flexible curtain and the first and second sensors converge to a predetermined edge of the flexible curtain to expose the operational surface of the target system when the flexible curtain defines the stowed configuration,
   the target system comprises a server closet configured to hold one or more server racks inside the server closet; and
   the flexible curtain is configured to be attached to any selected side of the server closet, and to extend across most of the selected side of the server closet, and the flexible curtain is translucent.

2. The system of claim 1, wherein the flexible curtain enables air flow through the major surface.

3. The system of claim 1, further comprising a bar to which the first and second sensor are secured, wherein the flexible curtain includes a plurality of loops configured to securely receive the bar such that the first and second sensor are at the first and second sensor locations.

4. The system of claim 3, wherein the bar is telescopic.

5. The system of claim 1, further comprising:
a processor; and
a memory communicatively coupled to the processor, the memory containing instructions that, when executed by the processor, cause the processor to:
receive the first and second condition as detected by the first and second sensor; and
transmit the first and second conditions to a remote computer.

6. The system of claim 5, the memory further containing instructions that, when executed by the processor, cause the processor to:
analyze the first and second condition as detected by the first and second sensor at the first and second sensor attachment locations;
identify an inefficiency of the first condition as detected by the first sensor; and
identify a third sensor attachment location as an improved sensor attachment location that is determined to be relatively more efficient than the first sensor attachment location.

7. The system of claim 6, the memory further containing instructions that, when executed by the processor, cause the processor to turn off the first sensor at the first sensor attachment location and turn on a third sensor secured to the flexible curtain at the third sensor attachment location in response to determining that the third sensor attachment location is relatively more efficient than the first sensor attachment location.

8. The system of claim 6, the memory further containing instructions that, when executed by the processor, cause the processor to move the first sensor from the first sensor attachment location to the third sensor attachment location in response to determining that the third sensor attachment location is relatively more efficient than the first sensor attachment location.

9. The system of claim 8 wherein moving the first sensor from the first sensor attachment location to the third sensor attachment location includes moving the first sensor closer to a predetermined edge of the flexible curtain.

10. The system of claim 8, the system further comprising a flexible frame,
wherein the first sensor is plugged into the flexible frame, and the flexible frame acts as a power source and a communication means for the first sensor, and
wherein moving the first sensor from the first sensor attachment location to the third sensor attachment location includes rotating the flexible frame including the first sensor around a fixed point of the flexible curtain.

11. The system of claim 1, further comprising a rod secured to a longitudinal edge of the curtain, wherein the stowed configuration includes the flexible curtain wrapped around the rod while the first and second sensor are secured to the first and second sensor attachment locations.

12. The system of claim 1, wherein the first condition includes temperature and the second condition includes humidity,
the system further comprising additional sensors for sensing particle mixture, noise, light, and gas.

* * * * *